United States Patent
Lecheler

[11] Patent Number: 5,828,188
[45] Date of Patent: Oct. 27, 1998

[54] OVER TEMPERATURE PROTECTION CIRCUIT HAVING PLURAL THERMAL COMPONENTS

[75] Inventor: Reinhard Lecheler, Neuberg an der Donau, Germany

[73] Assignee: Patent-Treuhand-Gesellschaft fur elektrische Gluhlampen mbH, Munich, Germany

[21] Appl. No.: 829,904

[22] Filed: Mar. 31, 1997

[30] Foreign Application Priority Data

Apr. 2, 1996 [DE] Germany .................. 196 13 077.8

[51] Int. Cl.⁶ ............................................. H05B 39/04
[52] U.S. Cl. ................. 315/309; 315/225; 315/DIG. 5
[58] Field of Search ................................ 315/224, 309, 315/225, 307, DIG. 5; 361/766, 760, 811, 782

[56] References Cited

U.S. PATENT DOCUMENTS

| | | | |
|---|---|---|---|
| 4,968,962 | 11/1990 | Hohider et al. | 361/417 |
| 5,051,661 | 9/1991 | Lee | 315/225 |
| 5,321,337 | 6/1994 | Hsu | 315/244 |

FOREIGN PATENT DOCUMENTS

| | | |
|---|---|---|
| 0 647 084A1 | 8/1994 | European Pat. Off. . |
| 0 682 465A1 | 5/1995 | European Pat. Off. . |
| 44 14 362A1 | 8/1995 | Germany . |

OTHER PUBLICATIONS

"Schaltnetzteile: Konzepte, Bauelemente, Anwendungen", Hirschmann, 1990, p. 102.

"Stromversorgungen fur die Praxis", Meyer, 1989, pp. 115–116.

Primary Examiner—Don Wong
Assistant Examiner—Wilson Lee

[57] ABSTRACT

A circuit arrangement for operating electrical lamps has a temperature sensor (NTC) as component part of an overtemperature protection circuit and at least one additional thermal component, which has flowing through it in the event of an overload a current which is increased compared with normal operation, and is thereby heated. The thermal component, for example one or more heating resistors (R5–R8), is coupled in a thermal manner to the temperature sensor (NTC), as a result of which the overtemperature protection circuit is consequently also triggered in the event of an overload.

9 Claims, 2 Drawing Sheets

OVER TEMPERATURE PROTECTION CIRCUIT HAVING PLURAL THERMAL COMPONENTS

FIELD OF THE INVENTION

The invention relates to electrical circuit arrangements suitable both for operating discharge lamps, in particular fluorescent lamps and high-pressure lamps, and for operating incandescent lamps, for example low-voltage incandescent halogen lamps.

BACKGROUND OF THE INVENTION

For the operation of discharge lamps, circuit arrangements of this type are generally called "electronic ballasts" (EB), while the designation "electronic transformer" or "electronic converter" is customary for the operation of low-voltage incandescent halogen lamps. The temperatures to which the components are exposed have a critical influence on the service life of a circuit arrangement. Impermissible heating of the components leads to premature failure of the circuit arrangement and must therefore be avoided. An overtemperature protection circuit, for example by means of a thermostatic switch, usually takes account of this state of affairs. Overtemperature protection is also desirable for safety reasons. In order, on the other hand, to protect components which are sensitive in the event of electrical overload and all the more so in the event of a short circuit, for example transistors and the like, sufficiently rapidly and reliably against thermal destruction, the overtemperature protection circuit generally reacts too sluggishly on account of its relatively high thermal capacity. Consequently, additional, rapidly acting sensor and overload protection circuits are necessary, which, for example, identify a short-circuited output and disconnect the circuit arrangement in good time.

An electronic transformer having such a monitoring and protection circuit for overload and/or overtemperature is already known from the printed publication DE-OS 44 14 362. The monitoring circuit comprises an overload measuring member and a temperature measuring member, in particular an NTC (thermistor) which are both decoupled from one another. The temperature measuring member is thermally coupled to the transistors of the inverter. In this solution it is disadvantageous that comparatively many components are required since overload and overtemperature are identified by different measuring members, that is, by the overload and the temperature measuring members.

SUMMARY OF THE INVENTION

It is the object of the invention to avoid the disadvantages stated and to specify a circuit arrangement for operating electrical lamps which comprises a rapidly acting protection circuit both against overtemperature and against overload. In this case, for the sake of brevity, the term "overload" here and below will also include the case of a short-circuited output of the circuit arrangement.

In addition the term protection circuit comprises also that part of the circuit which, in the case of overload, generates a signal which drives that part of the protection circuit which has a critical influence on the protective function.

The basic concept of the invention consists in introducing at least one additional component—referred to below as a thermal component—into the circuit arrangement in such a way that it heats up rapidly in the case of overload. In addition, the temperature sensor of an overtemperature protection circuit known per se is coupled in a deliberate manner to the at least one thermal component, as a result of which the temperature sensor correspondingly heats up in the event of an overload. Consequently, the overtemperature protection circuit does not just respond, in the manner that is customary, in the event of a rising ambient temperature, for example within a housing in which the circuit arrangement is situated, in the case of an increase in the temperature of the printed circuit board or of a component which is also heated during continuous operation under normal circumstances, for example of a power transformer or —as in DE-OS 44 14 362 the switching transistors of the switching member—. Rather the protection circuit also responds correspondingly rapidly in the event of electrical overload and disconnects the circuit arrangement, only temporarily, moreover, if that is appropriate, or reduces, by means of regulation, at least the mean power consumption.

The significant difference over the state of the art is that this is all managed by one and the same circuit and with relatively few components. In other words, both the overload and the overtemperature are identified with the same components—one or more thermal components and a temperature sensor—and one function is realized for the protection of the entire circuit arrangement.

In order to ensure a reliable protection function, it is necessary to manage the best possible thermal coupling between the temperature sensor and the thermal component (s). For this reason, the temperature sensor and the thermal component(s) are arranged in direct spatial proximity to one another. Furthermore, the temperature sensor and thermal component(s) can be connected to one another by means of thermally conductive paste or the like in order to improve the heat conduction between the thermal component(s) and the temperature sensor. It is particularly advantageous to arrange two or more thermal components around the temperature sensor, for example after the manner of an essentially closed heating collar when there are more than two thermal components.

The temperature sensor is designed, in particular, using SMD (Surface Mounted Device) technology. This has the advantage that the mass and thus also the thermal capacity of the temperature sensor are low. Consequently, even small amounts of heat suffice for a significant increase in the temperature of the temperature sensor. A sufficiently sensitive response of the overtemperature protection circuit is attained in this way.

Optionally, the thermal components may likewise be designed using SMD technology. This has the advantage that in this case the thermal components can be arranged appropriately near to the temperature sensor on account of their compact dimensions. The spatial proximity ensures good thermal coupling between the thermal component and the temperature sensor.

The temperature sensor and the thermal components are preferably arranged on a common printed circuit board. Since the thermal conductivity of the printed circuit board material is much greater than that of air, the thermal coupling between the thermal component and the temperature sensor is further improved by this measure. In the case of the preferred arrangement of the thermal components in the form of a collar, the temperature distribution around the temperature sensor is highly uniform for this reason. In addition, the temperature sensor takes up the temperature of the thermal components relatively rapidly. All this improves the response of the overtemperature protection circuit.

In an advantageous refinement, the thermal components are designed as resistors, particularly using SMD technology. The resistors are connected up to the circuit arrangement in such a way that they have flowing through them in the event of an overload a current which is increased compared with normal operation, and then act virtually as heating resistors. Since, on account of the Ohmic relationship $P=R \times I^2$, the electrical power P converted into heat in the resistor R is proportional to the square of the current I flowing through the resistor R, in the event of an overload even a relatively small increase in the current I results in a significant temperature increase $\Delta T$ of the resistor R, that is to say $\Delta T \propto I^2$. Consequently, a further improvement in the response sensitivity of the protection circuit is attained by this refinement.

The arrangement of the thermal components preferably in the form of a collar around the temperature sensor can be realized in a simple manner by connecting a corresponding number of individual resistors in series and/or in parallel. A particularly simple solution consists of a parallel circuit of two series circuits, each series circuit consisting of two serial heating resistors in each case. This variant has a number of advantages. On the one hand, for the total of four heating resistors, it is possible to use in each case identical types having an identical resistance. The total resistance of this circuit then corresponds precisely to the value of each individual heating resistor, which additionally simplifies dimensioning. On the other hand, the spatial arrangement is, in a simple manner, symmetrical, namely square or rhomboid, for example. Overall, this results in highly uniform heating of the temperature sensor and, consequently, a reliable response of the protection circuit.

In a particularly preferred embodiment of the invention for half-bridge-connected electronic converters, the heating resistor or the heating resistor circuit is connected between reference-earth potential and that diode which, in free running half-bridge converters, is usually connected in parallel with the bridge capacitor which is likewise connected to the reference-earth potential. The reason for this is that the current flowing through this path rises significantly in the event of an overload and thus supplies the heating current required for triggering the protection circuit.

Although a circuit arrangement of this type has already been disclosed in EP 0 647 084 A1, in that case the potential of the junction point between the resistor and the diode is fed to a signal shaping circuit. The shaped signal subsequently drives a disconnection element, which disconnects the converter in the event of an overload.

In contrast, the present invention dispenses entirely with a signal shaping circuit of this type. It merely exploits the fact, described in detail in EP 0 647 084 A1, that a significantly increased current flows through the said resistor in the event of an overload. This (heating) resistor is now used deliberately to heat a temperature sensor in that the resistor or the resistor circuit is coupled in a thermal manner to the temperature sensor of an overtemperature protection circuit.

In the simplest case, the overtemperature protection circuit consists only of one temperature-dependent component which triggers an at least temporary disconnection of the circuit arrangement. In other words, as soon as the temperature-dependent component is heated to impermissible temperatures—whether because of an increased ambient temperature or because of heating by means of the thermal components in the event of an overload—the circuit arrangement is disconnected.

In a particularly preferred embodiment of the invention for half-bridge-connected electronic converters, the overtemperature protection circuit consists of an NTC thermistor (NTC), in particular using SMD technology, which is connected in parallel with a charging capacitor. The charging capacitor is usually used in combination with a diac for the initial starting of the oscillation of self-controlled half-bridge converters (see, for example, EP 0 682 464 A1) and for restarting the oscillation after each zero crossing of the mains voltage (see, for example, EP 0 682 465 A1 and EP 0 647 084 A1). For this purpose, the charging capacitor is charged via a charging resistor. When the voltage of the charging capacitor reaches the triggering voltage of the diac, the diac turns on and starts the oscillation of the half-bridge converter.

In the normal state, the NTC has a very high resistance and has hardly any influence on the charge state of the charging capacitor. In the event of heating—either by a thermal component in the event of overload or as a result of increased ambient temperature in the event of overtemperature—on the other hand, the NTC acquires a low resistance. This changes the ratio of the voltage divider formed by the charging resistor and the NTC in such a way that the maximum voltage of the charging capacitor decreases. At an appropriately high temperature of the NTC or at an appropriately low resistance of the NTC, the maximum voltage which can be reached by the charging capacitor finally falls below the triggering voltage of the diac. In this case, the oscillation of the half-bridge converter ends upon the following zero crossing of the mains voltage or when the rectified pulsating supply voltage of the circuit arrangement falls below a voltage minimum. As long as the NTC has a sufficiently low resistance, the voltage of the charging capacitor remains below the triggering voltage of the diac. Consequently, oscillation is no longer initiated either, for a corresponding length of time.

Even as long as the maximum voltage of the charging capacitor is initially still greater than the triggering voltage of the diac during the heating of the NTC, an advantageous secondary effect is achieved by the abovementioned arrangement. Specifically, as the resistance of the NTC decreases, the time taken to reach the maximum voltage of the charging capacitor increases. If, then, by heating the NTC, the resistance of the latter becomes progressively lower, the time duration until the converter builds up oscillations again also consequently increases, which results in a desired reduction of the mean power consumption.

The particular advantage of the invention therefore consists in the fact that an efficient protection circuit is realized, using few and, moreover, inexpensive components, both in the event of overtemperature and in the event of an overload.

BRIEF DESCRIPTION OF THE DRAWINGS

The invention is explained in more detail with reference to the following exemplary embodiment. In the figures

BEST MODE FOR CARRYING OUT THE INVENTION

Figure 1:
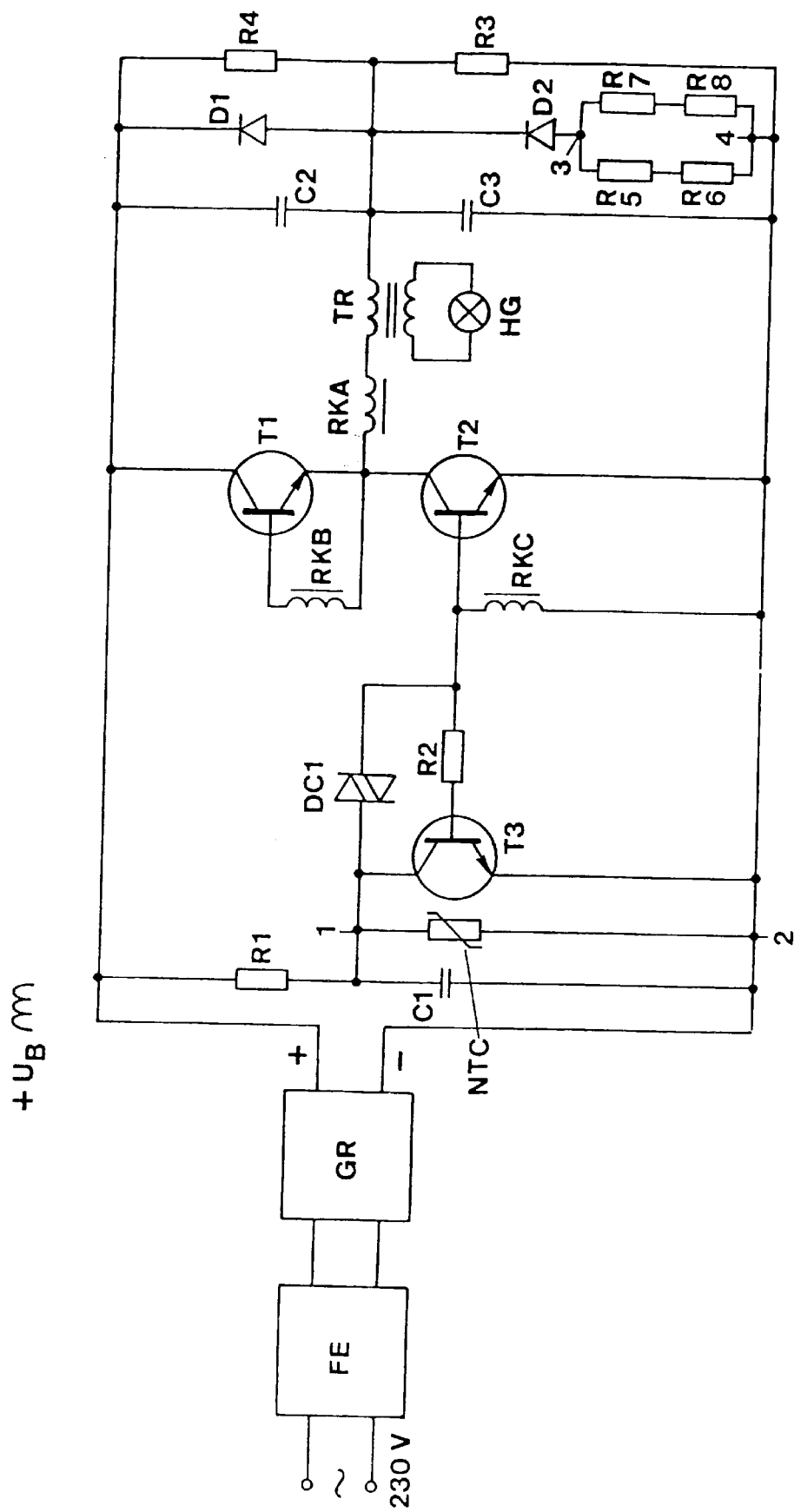
FIG. 1 shows a circuit diagram of an inventive electronic converter for low-voltage incandescent halogen lamps.

FIG. 1 shows the circuit diagram of an electronic converter for low-voltage incandescent halogen lamps. This comprises the function blocks of radio interference suppression FE, rectifier GR and a self-excited half-bridge converter with current feedback.

The radio interference suppression FE protects, in a manner known per se, the mains supply from radio-frequency interference signals of the half-bridge converter and comprises, for example, an interference suppression inductor and one or more capacitors (see, for example, H.-J. Meyer, "Stromversorgungen für die Praxis", (Practical Power Supplies), Vogel Buchverlag, Würzburg, 1989, pp. 115–116).

The rectifier GR comprises a diode full bridge (see, for example, W. Hirschmann and A. Hauenstein, "Schaltnetzteile" (Switched-mode power supplies), Siemens AG, 1990, p. 102) and converts the AC voltage from the mains supply into a pulsating DC voltage $+U_B$. In the following text, the negative pole of the rectifier is the reference-earth potential.

The half-bridge converter essentially comprises the two half-bridge transistors T1, T2, the two half-bridge capacitors C2, C3, the control transformer RKA-RKC for the current feedback and also the power transformer TR—a 12 V incandescent halogen lamp HG is operated on its secondary winding—and a trigger generator, comprising the resistor R1, the charging capacitor C1 and the diac DC1. The NPN transistor T3 and the series resistor R2 prevent the formation of trigger pulses while the half-bridge is oscillating. A resistor R3, R4 and a diode D1, D2 are respectively connected in parallel with each of the two half-bridge capacitors C2, C3. The resistors R3, R4 serve to balance the supply voltage. The diodes D1, D2 prevent the half-bridge capacitors C2, C3 from being negatively charged.

The protection circuit according to the invention is realized by an NTC thermistor NTC and a resistor circuit R5–R8. The resistor circuit R5–R8 is connected between the reference-earth potential and the diode D2 assigned to the bridge transistor T2 which is connected to the reference-earth potential. The resistor circuit R5–R8 consists of the parallel circuit of two series circuits. For their part, the series circuits each consist of two serial heating resistors R5, R6 and R7, R8. In the event of an overload, an increased current flows through the diode D2 and, consequently, likewise through the resistor circuit R5–R8. This increased current causes the heating resistors R5–R8 to be heated. For a detailed explanation regarding how the increased current in the event of an overload comes about, reference is made to EP 0 647 084 A1.

The NTC thermistor NTC is connected in parallel with the charging capacitor C1. If it is heated, for example in the event of an overload due to the resistors R5–R8, its resistance is reduced and, consequently, increasingly short-circuits the charging capacitor C1. As a result, it finally deactivates the trigger generator and, after the following zero crossing of the mains voltage, prevents the half-bridge converter from building up oscillations again.

Figure 2:
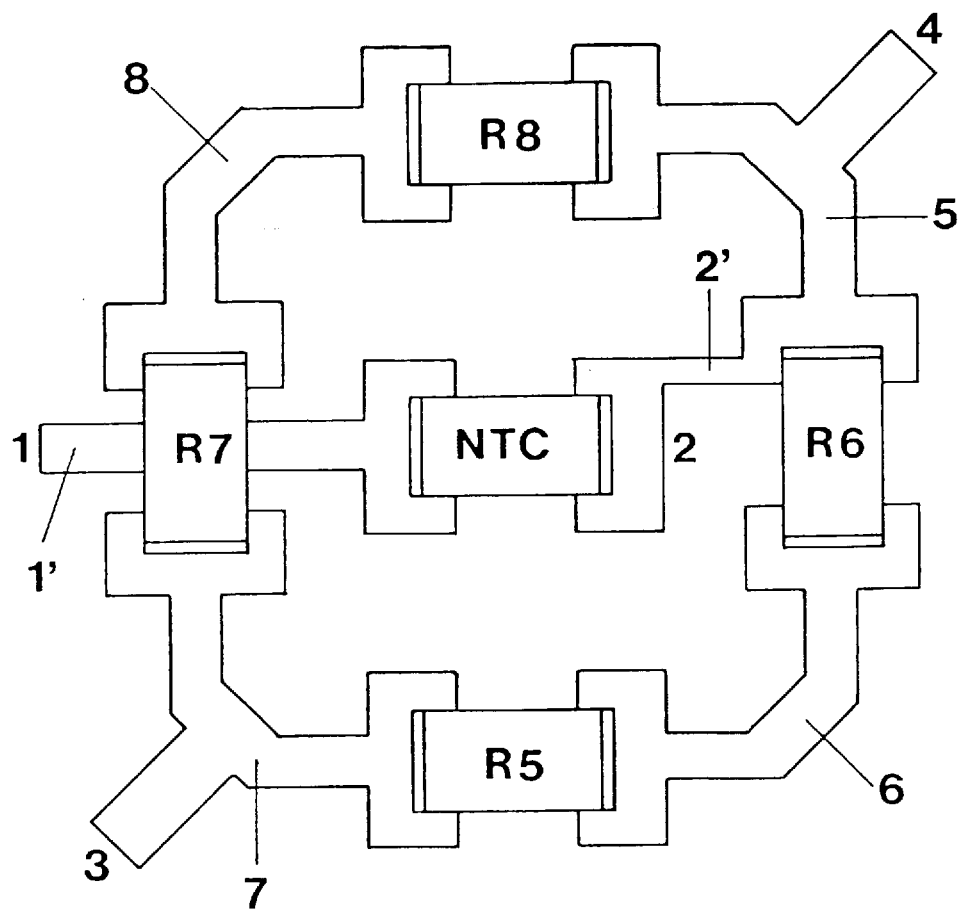
FIG. 2 shows a diagrammatic illustration of the spatial arrangement (layout) of the heating resistors and of the NTC on the printed circuit board in accordance with the circuit from FIG. 1.

FIG. 2 diagrammatically illustrates the spatial arrangement of the heating resistors R5–R8 and of the NTC thermistor NTC on the printed circuit board. The designation of the components and of the connections corresponds to that in FIG. 1. The NTC thermistor NTC and the heating resistors R5–R8 are designed using SMD technology and, consequently, are soldered directly to the associated conductor tracks. The heating resistors R5–R8 are arranged in a manner corresponding to the sides of a square around the NTC thermistor NTC. The individual heating resistors are connected to one another by means of four conductor track segments 5–8. The two connections 3, 4 of this resistor circuit are situated at two diagonally opposite corners of the arrangement. Viewed from the connections 3, 4, the branching current path of the resistor arrangement consequently has the shape of a rhombus. On one of its connection sides, the NTC thermistor NTC is connected to a conductor track segment 1, which is routed under the heating resistor R7 and has the connection 1 at its free end. The other connection side of the thermistor NTC is assigned to the connection 2 in FIG. 1 and, accordingly, is connected via the conductor track segments 2' and 5 to the connection 4 of the resistor arrangement.

What is claimed is:

1. Circuit arrangement having a temperature sensor (NTC) as component part of an overtemperature protection circuit, characterized by at least two or more additional thermal components (R5–R8) which are arranged in a manner distributed uniformly around and thermally coupled to the temperature sensor (NTC), the at least two or more thermal component (R5–R8) having flowing through them in the event of an overload a current which is increased compared with normal operation, and thereby being heated, as a result of which the overtemperature protection circuit is consequently triggered in the event of an overload.

2. Circuit arrangement according to claim 1, characterized in that heating resistors (R5–R8) are used as thermal components.

3. Circuit arrangement according to claim 2, characterized in that the number of heating resistors (R5–R8) is even, half of the number of heating resistors in each case forming a series circuit (R5, R6; R7, R8), and the two series circuits in turn being connected in parallel with one another.

4. Circuit arrangement according to claim 3, characterized in that all of the heating resistors (R5–R8) have the same resistance value and, consequently, the two currents flowing in the two series circuits (R5, R6; R7, R8) each have the same intensity, as a result of which uniform heating of the temperature sensor (NTC) is attained.

5. Circuit arrangement according to claim 4, characterized in that the number of heating resistors is four.

6. Circuit arrangement according to claim 5, characterized in that one of the total of four heating resistors (R5–R8) is in each case arranged along each side of an imaginary square, the temperature sensor (NTC) being arranged in the centre of this square.

7. Circuit arrangement according to claim 1, characterized in that an NTC thermistor (NTC) is used as temperature sensor.

8. Circuit arrangement according to claim 7, characterized in that the circuit arrangement has the following additional features:

a free running half-bridge converter having two bridge transistors (T1, T2), a bridge capacitor (C2, C3) and also a bridge diode (D1, D2) being respectively connected in parallel with the two bridge transistors (T1, T2), a start generator having a charging capacitor (C1), the start generator, provided that the charging capacitor (C1) is charged to a predetermined threshold voltage, restarting the oscillation of the half-bridge converter after each zero crossing of the mains voltage, the NTC thermistor (NTC) being connected in parallel with the charging capacitor (C1), and the heating resistors (R5–R8) being connected between the reference-earth potential and the associated bridge diode (D2).

9. Circuit arrangement according to claim 1, characterized in that the thermal sensor or NTC thermistor (NTC) and/or the thermal component or heating resistor (R5–R8) are realized using SMD (Surface Mounted Device) technology.

* * * * *